United States Patent
Kramer et al.

(10) Patent No.: US 12,262,473 B1
(45) Date of Patent: Mar. 25, 2025

(54) ACTIVE ANTENNA MODULE USING PRINTED CIRCUIT BOARD TECHNOLOGY

(71) Applicant: Altum RF IP B.V., Eindhoven (NL)

(72) Inventors: Niels Kramer, 's-Hertogenbosch (NL); Sebastiaan Laurens Coenen, Eindhoven (NL); Ernesto Puangco Cenidoza, Lipa (PH)

(73) Assignee: ALTUM RF IP B.V., De Zaale (NL)

( * ) Notice: Subject to any disclaimer, the term of this patent is extended or adjusted under 35 U.S.C. 154(b) by 258 days.

(21) Appl. No.: 18/125,209

(22) Filed: Mar. 23, 2023

(51) Int. Cl.
  H05K 1/14  (2006.01)
  H05K 1/02  (2006.01)
  H05K 3/46  (2006.01)

(52) U.S. Cl.
  CPC ........... H05K 1/145 (2013.01); H05K 1/0201 (2013.01); H05K 3/4697 (2013.01); H05K 2201/10098 (2013.01)

(58) Field of Classification Search
  CPC .... H05K 1/145; H05K 1/0201; H05K 3/4697; H05K 2201/10098
  See application file for complete search history.

(56) References Cited

U.S. PATENT DOCUMENTS

| | | | | |
|---|---|---|---|---|
| 2003/0020173 A1* | 1/2003 | Huff | .......................... | H01G 5/16 257/774 |
| 2003/0060172 A1* | 3/2003 | Kuriyama | ............ | H05K 1/0206 455/575.1 |
| 2007/0053167 A1* | 3/2007 | Ueda | ...................... | H05K 1/144 257/E23.125 |
| 2015/0346322 A1* | 12/2015 | Schmalenberg | ...... | G01S 13/931 342/175 |
| 2016/0037640 A1* | 2/2016 | Takai | ................... | H05K 1/0298 361/753 |
| 2019/0304936 A1* | 10/2019 | Shaul | ...................... | H01L 24/20 |
| 2020/0066621 A1* | 2/2020 | Liu | ..................... | H01L 23/5386 |
| 2021/0280490 A1* | 9/2021 | Gavagnin | ............ | H05K 1/0204 |
| 2023/0395967 A1* | 12/2023 | Astorga | ............ | H01Q 21/0025 |
| 2024/0023229 A1* | 1/2024 | Chou | ................... | H01Q 1/2283 |
| 2024/0128994 A1* | 4/2024 | Motohashi | ................ | H01P 5/08 |

* cited by examiner

Primary Examiner — Hoa C Nguyen

(74) Attorney, Agent, or Firm — Maiorana Patent Law, PA

(57) ABSTRACT

An apparatus comprising a first printed circuit board and a second printed circuit board. The first printed circuit board may comprise a plurality of amplifier circuits, a plurality of inputs and a first interconnection network. The second printed circuit board may comprise a plurality of antenna modules and a second interconnection network. The first interconnection network may be configured to connect each of the inputs to a respective one of the plurality of amplifier circuits, and the plurality of amplifier circuits to the second interconnection network. The second interconnection network may be configured to connect the amplifier circuits to the plurality of antenna modules. The first printed circuit board may be affixed to the second printed circuit board using a conductive epoxy material.

20 Claims, 6 Drawing Sheets

ACTIVE ANTENNA MODULE USING PRINTED CIRCUIT BOARD TECHNOLOGY

FIELD OF THE INVENTION

The invention relates to antenna modules generally and, more particularly, to a method and/or apparatus for implementing an active antenna module using printed circuit board technology.

BACKGROUND

Antenna modules are used in many communications systems and devices. Antenna modules are designed using printed circuit boards to connect amplifiers and other circuitry to the antennas. Conventional antenna modules implement large, bulky panels. The printed circuit boards of conventional antenna modules often have active components mounted on an opposite side to the antennas. Mounting the active components and the antennas on opposite sides of the printed circuit boards adds complexity and cost to providing adequate heatsinking. Conventional antenna modules have a fixed design during manufacturing and are difficult to modify. When broken, conventional antenna modules are costly to replace or rework.

It would be desirable to implement an active antenna module using printed circuit board technology.

SUMMARY

The invention concerns an apparatus comprising a first printed circuit board and a second printed circuit board. The first printed circuit board may comprise a plurality of amplifier circuits, a plurality of inputs and a first interconnection network. The second printed circuit board may comprise a plurality of antenna modules and a second interconnection network. The first interconnection network may be configured to connect each of the inputs to a respective one of the plurality of amplifier circuits, and the plurality of amplifier circuits to the second interconnection network. The second interconnection network may be configured to connect the amplifier circuits to the plurality of antenna modules. The first printed circuit board may be affixed to the second printed circuit board using a conductive epoxy material.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
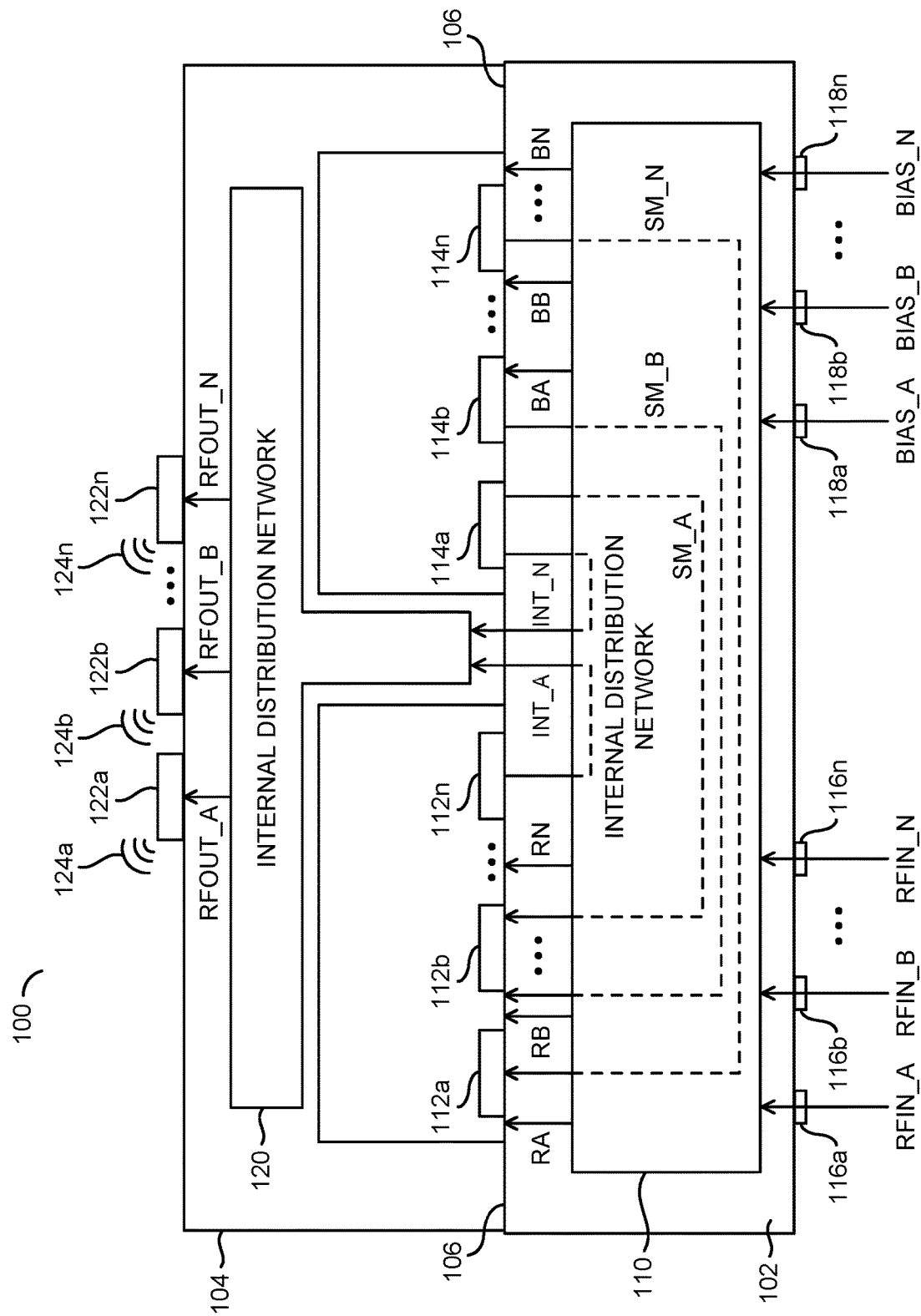
FIG. 1 is a diagram illustrating an example embodiment of the present invention.

Embodiments of the present invention include providing an active antenna module using printed circuit board technology that may (i) improve panel yield, (ii) be easy to replace and rework using a standard surface mount technology process, (iii) provide a modular array design, (iv) enable vertical stacking of antenna elements over amplifier circuitry to limit total area occupied, (v) facilitate designing arrays at high frequencies by allowing adequate spacing between radiating elements, (vi) enable heat dissipation through a bottom-side pad, (vii) provide a flexible redistribution of crossovers of direct current and radio frequency connections, (viii) be highly customizable with low tooling costs, (ix) provide air cavities for robust performance at millimeter-wave frequencies, and/or (x) be implemented as one or more integrated circuits.

Embodiments of the present invention may be configured to implement an active antenna module and/or other types of communication circuits. In one example, the active antenna module may comprise a monolithic microwave integrated circuit (MMIC) configured to operate at millimeter-wave frequencies. For example, the active antenna module may enable radio frequency (RF) communication to/from antenna elements and a transmission of direct current between antenna elements, amplifier circuits and/or other components.

Embodiments of the present invention may be implemented comprising at least two parts (e.g., two printed circuit boards). One of the printed circuit boards may comprise amplifier circuits. Another one of the printed circuit boards may comprise antenna elements. The printed circuit board (PCB) comprising the amplifier circuits may further comprise ancillary components. In one example, the ancillary components may comprise surface mount devices. The PCBs may be stacked on top of each other. In one example, the PCB comprising the antenna elements may be implemented on top of the PCB comprising the amplifier circuits (e.g., the PCB comprising the antenna elements may be a top PCB and the PCB comprising the amplifier circuits may be a bottom PCB). Implementing the PCB with antenna elements above another PCB with amplifier circuits may enable the active antenna module device to occupy a limited amount of physical space (e.g., the device may occupy less physical space than a device that implements antenna elements and amplifier circuits on a single PCB).

The top PCB may be affixed to the bottom PCB. In one example, the top PCB may be affixed to the bottom PCB using an epoxy material (e.g., a conductive epoxy). The epoxy material may implement a secure hold (e.g., attachment) between the two PCBs. Attaching the top PCB to the bottom PCB may form one or more cavities. In an example, the top PCB may comprise a number of carved out spaces at a bottom end that may create a cavity (e.g., an air gap) when connected over the top surface of the bottom PCB. The amplifier circuits and/or any ancillary components may be implemented within the cavity. The top PCB may comprise a center pillar in between the carved out spaces. In one example, the center pillar may provide a material that separates the air gaps in order to create at least two cavities. In another example, the center pillar may provide a material that provides structural support and a single, continuous cavity may be formed around the center pillar. In yet another example, the top PCB may be implemented without the center pillar.

Generally, the top PCB and the bottom PCB may be configured to have different properties and/or functionality. In some embodiments, the two PCBs may be fabricated and/or assembled in an array form. In some embodiments, the two PCBs may be fabricated in a strip form. Fabricating the PCBs in a strip and/or array form may enable the apparatus to be fabricated at a low manufacturing cost (e.g., a lower cost than implementing a single PCB design). The fabrication method used to implement the apparatus may be varied according to the design criteria of a particular implementation.

The bottom PCB may comprise an interconnection network within the material of the PCB. The interconnection network may comprise blind vias and/or through vias. The interconnection network may provide one or more inputs to the bottom PCB. The inputs may receive signals and enable the interconnection network to provide a path from the inputs to the amplifier circuits and/or the ancillary components. The top PCB may comprise an interconnection network. The interconnection network may comprise blind vias and/or through vias. The interconnection network of the top PCB may connect the antenna elements to the interconnection network of the bottom PCB. In some embodiments, the interconnection network of the top PCB may be implemented through the center pillar. In some embodiments, the interconnection network of the top PCB may be implemented through outside portions on either side of the cavities. The implementation of the interconnection networks may be varied according to the layout of the circuits implemented by the PCBs and/or the design criteria of a particular implementation.

Embodiments of the present invention may comprise tested and evaluated sub-array parts provided as surface mount technology components in order to improve panel yield. The active antenna module may be easy to replace and/or rework when broken. For example, the active antenna array module may be compatible with a standard surface mount technology rework process. In one example, the active antenna array modules may provide a modular design in order to be easily replaced.

The vertical stacking of the antenna elements over the amplifier circuitry may enable embodiments of the present invention to occupy a small area (e.g., smaller than a layout with the antenna elements located on a same plane as the amplifier circuits). The vertical stack implementation may facilitate high frequency arrays to be constructed with sufficient spacing between radiating elements to support communication using the high frequencies. The vertical stack implementation may enable heat dissipation through a bottom-side pad.

The PCBs may comprise a multilayer laminate. The multilayer laminate may provide a flexible redistribution and/or crossovers of direct current and/or RF connections. In some embodiments, different laminate materials may be mixed and/or combined in the stackup. Mixing and/or combining laminate materials may enable designs that provide various and/or desired properties for the implementation of the antenna elements and/or MMIC mounting. The PCBs may be manufactured as a highly customizable module with low tooling costs.

Implementing the air cavity (or air cavities) may enable robust MMIC performance at millimeter-wave frequencies. The air cavity may provide sufficient space to implement additional surface mount devices around the amplifier MMICs. For example, because the antenna modules are implemented separately on the top PCB, more area may be available on the bottom PCB to space out the various components (e.g., amplifier circuits and/or surface mount devices). In one example, the additional devices may comprise a bypass and/or decoupling capacitors. The air cavity may provide electromagnetic shielding for each of the amplifier MMICs. In one example, the air cavity (or cavities) may prevent and/or reduce an amount of cross talk between the amplifier circuits and/or other components. In another example, the air cavity may prevent and/or reduce an amount of electromagnetic interference between the amplifier circuits and/or other components.

The bottom PCB may implement various integrated circuits. In one example, the integrated circuits may comprise Si beamformers (e.g., providing amplification, gain and phase control). In another example, the integrated circuits may comprise GaAs amplifiers. In yet another example, the integrated circuits may comprise GaN amplifiers. In still another example, the integrated circuits may comprise surface mount devices and/or chip caps. Both bare dies and/or packaged devices may be used. In some embodiments, the amplifier circuits may implement power amplifiers. In some embodiments, the amplifier circuits may implement low noise amplifiers. The integrated circuits implemented by the bottom PCB may be varied according to the design criteria of a particular implementation.

Embodiments of the present invention may be assembled in a matrix form. For example, in one step hundreds (or thousands or more) of the active antenna modules may be fabricated. The active antenna modules may be manufactured cost effectively by combining PCB technology and integrated circuit packaging technology.

Embodiments of the present invention may be used in various applications. The active antenna modules may be implemented for both reception and/or transmission. In some embodiments, the active antenna modules may be implemented as a sub-array component in a phased array system. In one example, the active antenna modules may be implemented in telecommunications applications. In another example, the active antenna modules may be implemented in satellite communications applications. In yet another example, the active antenna modules may be implemented in radar applications. The particular applications that implement the active antenna modules according to the present invention may be varied according to the design criteria of a particular implementation.

Referring to FIG. 1, a diagram illustrating an example embodiment of the present invention is shown. A block (or circuit, or module, or apparatus) 100 is shown. The apparatus 100 may implement a combination of printed circuit boards. The apparatus 100 may be configured as an active antenna module. The active antenna module 100 may be configured to transmit and/or receive radio frequency (RF) signals. For example, the active antenna module 100 may be a transmitter/receiver. The active antenna module 100 may be configured to receive direct current signals. The active antenna module 100 may be configured to provide crossovers of direct current and/or RF connections. In one example, the active antenna module 100 may be configured to operate at millimeter wave frequencies (e.g., approximately 30 GHZ). In another example, the active antenna module 100 may be configured to operate at frequencies up to approximately 100 GHz. The frequencies and/or frequency ranges supported by the apparatus 100 may be varied according to the design criteria of a particular implementation.

The apparatus 100 may comprise a printed circuit board 102 and/or a printed circuit board 104. The printed circuit board (PCB) 102 may implement an amplifier circuit board. The printed circuit board (PCB) 104 may implement an antenna element board. In the example orientation shown, the PCB 102 may be implemented as a bottom PCB and the PCB 104 may be implemented as a top PCB. The bottom PCB 102 and the top PCB 104 may be fabricated as separate boards.

In the example shown, the bottom PCB 102 and the top PCB 104 may be attached and/or affixed to each other. For example, the apparatus 100 is shown as a combination of the bottom PCB 102 and the top PCB 104. A line 106 is shown. The line 106 may illustrate a location that the bottom PCB 102 and the top PCB 104 may be affixed together.

The bottom PCB 102 may comprise a block (or circuit) 110, a number of blocks (or circuits) 112a-112n, a number of blocks (or circuits) 114a-114n, a number of ports 116a-116n and/or a number of ports 118a-118n. The block 110 may implement an interconnection network. The circuits 112a-112n may each implement an amplifier circuit. The circuits 114a-114n may each implement other types of circuits. The ports 116a-116n may comprise mounting pads. The ports 118a-118n may comprise mounting pads. The bottom PCB 102 may comprise other components (not shown). The number, type and/or arrangement of the components of the bottom PCB 102 may be varied according to the design criteria of a particular implementation.

The interconnection network 110 is shown within the bottom PCB 102. The interconnection network 110 may implement an internal distribution network. The interconnection network 110 may comprise a number of vias (e.g., through vias and/or blind vias) and/or traces. The interconnection network 110 may be configured to enable signals to be communicated and/or transmitted through various layers of the bottom PCB 102. Details of the interconnection network 110 may be shown in association with FIG. 4.

The amplifier circuits 112a-112n and/or the other types of circuits 114a-114n may each be connected on a top surface of the bottom PCB 102. For illustrative purposes, the amplifier circuits 112a-112n are shown implemented next to each other and the other types of circuits 114a-114n are shown implemented next to each other. However, the amplifier circuits 112a-112n and/or the other types of circuits 114a-114n may be arranged in various patterns across the top surface of the bottom PCB 102. For example, one or more of the other types of circuits 114a-114n may be implemented next to each of the amplifier circuits 112a-112n. Any number of amplifier circuits 112a-112n may be implemented (e.g., 1 amplifier, 2 amplifiers, 4 amplifiers, etc.). In the example shown, multiple of the amplifier circuits 112a-112n may be implemented as a generalized example. In some embodiments, the bottom PCB 102 may implement a single amplifier circuit 112a. In some embodiments, the amplifier circuits 112a-112n may comprise power amplifiers and/or noise amplifiers. The other types of circuits 114a-114n may comprise surface mount devices. In some embodiments, the surface mount devices 114a-114n may implement beamformer circuits, gain control circuits, phase control circuits, etc. In one example, the other types of circuits 114a-114n may comprise active components and/or passive components. In some embodiments, the bottom PCB 102 may be implemented without the surface mount devices 114a-114n. The number, type and/or arrangement of the amplifier circuits 112a-112n and/or the surface mount devices 114a-114n may be varied according to the design criteria of a particular implementation.

The mounting pads 116a-116n and/or the mounting pads 118a-118n may be implemented on the bottom of the bottom PCB 102. In some embodiments, the bottom PCB 102 may be implemented without the mounting pads 118a-118n. The mounting pads 116a-116n and the mounting pads 118a-118n may each be configured to receive input signals for the apparatus 100. Generally, one of the mounting pads 116a-116n may be implemented for each of the amplifier circuits 112a-112n. In an example with the apparatus 100 implementing the single amplifier circuit 112a, one of the mounting pads (e.g., the mounting 116a) may be implemented. In some embodiments, one of the mounting pads 118a-118n may be implemented for more than one of the amplifier circuits 112a-112n and/or the surface mount devices 114a-114n. For example, there may be fewer of the mounting pads 118a-118n than the number of the mounting pads 116a-116n. In some embodiments, the mounting pads 116a-116n and/or the mounting pads 118a-118n may be configured to provide heat dissipation for the apparatus 100.

The bottom PCB 102 may be configured to receive a number of signals (e.g., RFIN_A-RFIN_N) and/or a number of signals (e.g., (BIAS_A-BIAS N). The signals RFIN_A-RFIN_N may comprise input radio frequency (RF) signals. The signals BIAS_A-BIAS N may comprise bias signals (e.g., DC biasing signals). In an example, the mounting pads 116a-116n may present signals RFIN_A-RFIN_N to the RF interconnection network 110. The interconnection network 110 may present signals (e.g., RA-RN) to the top surface of the bottom PCB 102 (e.g., to the amplifier circuits 112a-112n) in response to the signals RFIN_A-RFIN_N. In an example, the mounting pads 118a-118n may present the bias signals BIAS_A-BIAS N to the interconnection network 110. The interconnection network 110 may present signals (e.g., BA-BN) to the top surface of the bottom PCB 102 in response to the signals BIAS_A-BIAS N. The signals BA-BN may be presented to the amplifier circuits 112a-112n and/or the surface mount devices 114a-114n. The number and/or types of signals communicated through and/or within the bottom PCB 102 may be varied according to the design criteria of a particular implementation.

The amplifier circuits 112a-112n may be configured to generate signals (e.g., INT_A-INT_N) in response to the RF signals RA-RN and/or the bias signals BA-BN. The signals INT_A-INT_N may comprise amplified versions of the RF signals RA-RN. The signals INT_A-INT_N may be presented to the interconnection network 110. The interconnection network 110 may be configured to present the amplified signals INT_A-INT_N to the top PCB 104.

The surface mount devices 114a-114n may be configured to generate signals (e.g., SM_A-SM_N) in response to the RF signals RA-RN and/or the bias signals BA-BN. The signals SM_A-SM_N may comprise gain adjustments, phase adjustments and/or other control signals. The signals SM_A-SM_N may be presented to the interconnection network 110. The interconnection network 110 may be configured to present the signals SM_A-SM_N to the amplifier circuits 112a-112n.

The top PCB 104 may comprise a block (or circuit) 120 and/or a number of blocks (or circuits) 122a-122n. The block 120 may implement an interconnection network. The circuits 122a-122n may each implement an antenna element (or module). The top PCB 104 may comprise other components (not shown). The number, type and/or arrangement of the components of the top PCB 104 may be varied according to the design criteria of a particular implementation.

The interconnection network 120 is shown within the top PCB 104. The interconnection network 120 may implement an internal distribution network. The interconnection network 120 may comprise a number of vias (e.g., through vias and/or blind vias) and/or traces. The interconnection network 120 may be configured to enable signals to be communicated and/or transmitted through various layers of the top PCB 104. Details of the interconnection network 120 may be shown in association with FIG. 3.

The antenna elements (or modules) 122a-122n may each be connected on a top surface of the top PCB 104. For illustrative purposes, the antenna elements 122a-122n are shown implemented as discrete devices next to each other. However, the antenna elements 122a-122n may be arranged in various patterns across the top surface of the top PCB 104. For example, the antenna elements 122a-122n may be arranged to form an antenna array pattern. Any number of antenna elements 122a-122n may be implemented (e.g., 1 amplifier, 2 amplifiers, 4 amplifiers, etc.). For example, one of the antenna elements 122a-122n may be implemented for each of the amplifier circuits 112a-112n implemented by the bottom PCB 102. In one example, a single antenna element 122a may be implemented corresponding to the single amplifier circuit 112a. The antenna elements 122a-122n may each be configured to present and/or receive wireless information 124a-124n. The antenna elements 122a-122n may be implemented on a top layer of the top PCB 104. In an example, the antenna elements 122a-122n may comprise a horizontal copper layer that may be connected to the vias within the top PCB 104. For example, the antenna elements 122a-122n may comprise a horizontal copper layer that may be connected to the interconnection network 120. The antenna elements 122a-122n may be connected to a metal layer on top of the top PCB 104 and/or patches on the top PCB 104. The number of the antenna elements 122a-122n may be varied according to the design criteria of a particular implementation.

The top PCB 104 may be configured to receive the amplified signals INT_A-INT_N from the bottom PCB 102. For example, the interconnection network 120 of the top PCB 104 may be connected to the interconnection network 110 of the bottom PCB 102. The interconnection network 120 may receive the amplified signals INT_A-INT_N from the interconnection network 110. The interconnection network 120 may present signals (e.g., RFOUT_A-RFOUT_N) to the top surface of the top PCB 104 (e.g., to the antenna elements 122a-122n) in response to the signals INT_A-INT_N. The signals RFOUT_A-RFOUT_N may be output RF signals for communication by the antenna elements 122a-122n. The output RF signals RFOUT_A-RFOUT_N may be presented to the antenna elements 122a-122n. The antenna elements 122a-122n may generate the wireless information 124a-124n in response to the output RF signals RFOUT_A-RFOUT_N. The number and/or types of signals communicated through and/or within the top PCB 104 may be varied according to the design criteria of a particular implementation.

In the example shown, the apparatus 100 may be configured as a transmit device. In some embodiments, the apparatus 100 may be configured to provide reception and/or transmission. For example, the antenna elements 122a-122n may be configured to receive the wireless information 124a-124n. The antenna elements 122a-122n may provide the wireless information to the interconnection network 120. The interconnection network 120 may provide the wireless information to the interconnection network 110 of the bottom PCB 102. The interconnection network 110 may provide the received wireless information to the amplifier circuits 112a-112n. The amplifier circuits 112a-112n may present output data to the interconnection network 110. The interconnection network 110 may present the output data to outputs at the mounting pads 116a-116n.

The apparatus 100 generally comprises two parts (e.g., the bottom PCB 102 and the top PCB 104), which may be glued together using a conductive epoxy material (not shown). Generally, the bottom PCB 102 may comprise the amplifiers 112a-112n and any ancillary surface mount device components 114a-114n. The top PCB 104 may comprise the antenna elements 122a-122n. In one example, the bottom PCB 102 and the top PCB 104 may each be fabricated and/or assembled in an array form. In another example, the bottom PCB 102 and the top PCB 104 may each be fabricated and/or assembled in a strip form. The array form and/or strip form may enable the apparatus 100 to be developed at a low manufacturing cost. Sidewalls of the apparatus 100 may be fabricated as part of a multi-layer lid and/or base processing. After gluing the bottom PCB 102 to the top PCB 104, the assembled module arrays may be sawn into individual devices (e.g., to create multiple implementations of the apparatus 100). Each implementation of the apparatus 100 may be used as a surface mount technology (SMT) device.

Figure 2:
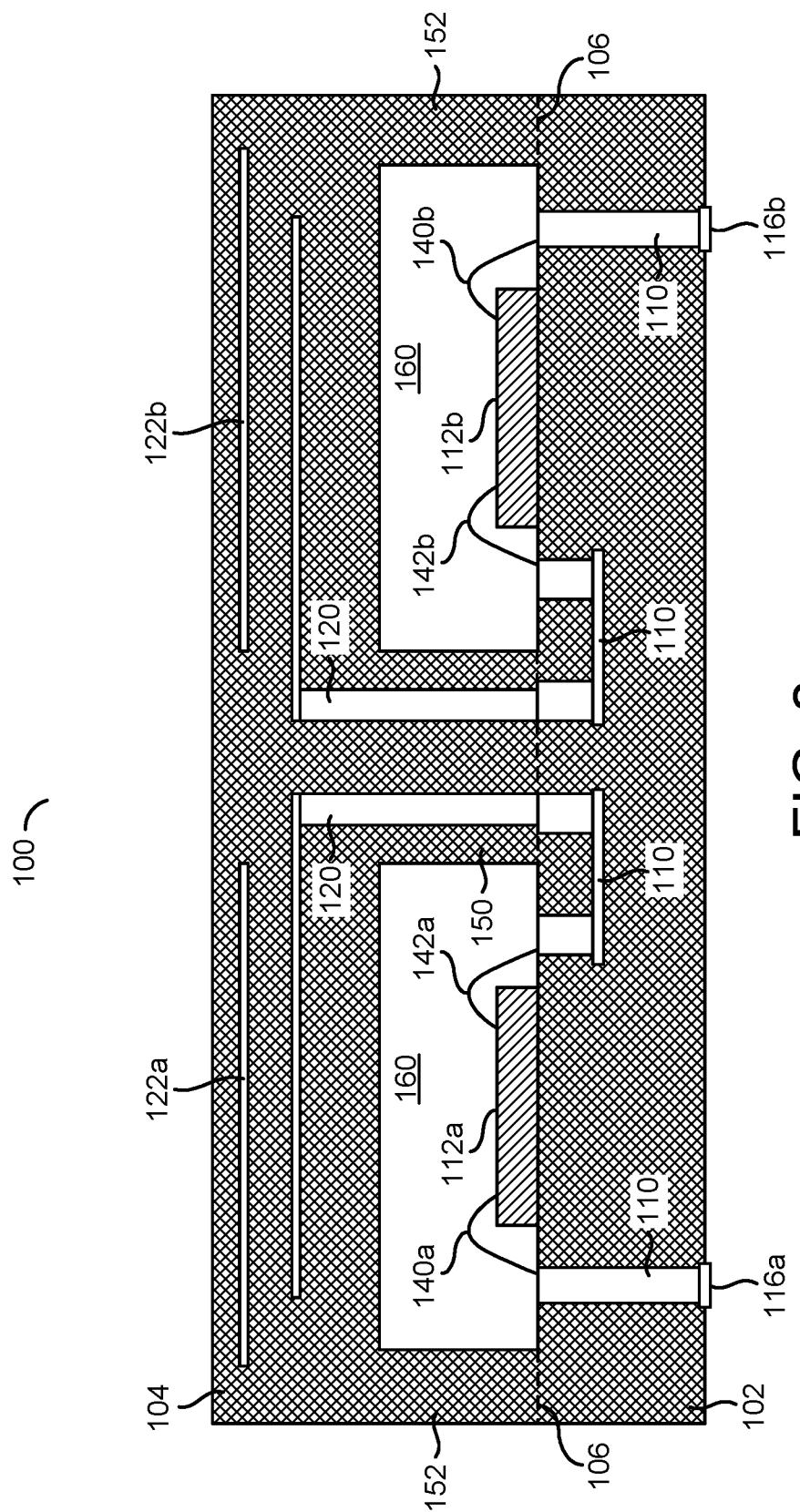
FIG. 2 is a diagram illustrating a cross-section of an example embodiment of the present invention.

Referring to FIG. 2, a diagram illustrating a cross-section of an example embodiment of the present invention is shown. A cross-section of the apparatus 100 is shown. In the example shown, the apparatus 100 is shown having a generally rectangular shape. For example, the apparatus 100 may have a longer width than height. In one example, the apparatus 100 may be implemented with dimensions of 1 cm×1 cm. In another example, the apparatus 100 may be smaller than 1 cm×1 cm. In some embodiments, the apparatus 100 may have a hexagonal shape. The size and/or shape of the apparatus 100 may be varied according to the design criteria of a particular implementation.

In the example shown, the bottom PCB 102 and the top PCB 104 are shown. Vias implementing the internal distribution network 110 in the bottom PCB 102 and vias implementing the internal distribution network 120 in the top PCB 104 are shown. As an illustrative example, the example shown may comprise two of the amplifier circuits 112a-112b and two of the antenna elements 122a-122b. For example, the two antenna elements 122a-122b may be implemented with the two respective amplifier circuits 112a-112b. In the example shown, the bottom PCB 102 may comprise the amplifier circuits 112a-112b without implementing any of the surface mount components 114a-114n. The mounting pad inputs 116a-116b may be configured to provide a respective input to the amplifier circuits 112a-112b. In the example shown, the bottom PCB 102 may be implemented without the mounting pad inputs 118a-118n (e.g., no bias input may be implemented in the embodiment shown).

Electrical connections 140a-142a are shown for the amplifier circuit 112a and electrical connections 140b-142b are shown for the amplifier circuits 112b. The connections 140a-142a and/or the connections 140b-142b may comprise MMIC electrical connections. In some embodiments, the connections 140a-142a and/or the connections 140b-142b may be configured to provide crossovers of direct current and/or RF connections. The connections 140a-142a and/or the connections 140b-142b may comprise wire bonds, ribbon bonds, flip-chip solder bumps and/or hotvias. The types of connections implemented may be varied according to the design criteria of a particular implementation.

The interconnection network 110 may be configured to connect the RF inputs 116a-116b to the respective amplifier circuits 112a-112b. The interconnection network 110 may be configured to connect the amplifier circuits 112a-112b to the top PCB 104. The shape, pathways and/or interconnections between various components implemented by the interconnection network 110 may be varied according to the design criteria of a particular implementation.

In the example shown, the input RF signal RFIN_A may be presented to the mounting pad 116a and the RF signal RFIN_B may be presented to the mounting pad 116b. The interconnection network 110 may transmit the RF signal RFIN_A from the mounting pad 116a to the connection 140a of the amplifier circuit 112a. The interconnection network 110 may transmit the RF signal RFIN_B from the mounting pad 116a to the connection 140a of the amplifier circuit 112b. The amplifier circuits 112a-112b may be configured to generate the amplified signals INT_A-INT_B in response to the RF signals RFIN_A-RFIN_B. The connection 142a of the amplifier circuit 112a may present the amplified signal INT_A to the interconnection network 110. The connection 142b of the amplifier circuit 112b may present the amplified signal INT_B to the interconnection network 110. The interconnection network 110 may present the amplified signals INT_A-INT_B to the top PCB 104.

The dotted line 106 is shown representing where the bottom PCB 102 is affixed to the top PCB 104. The top PCB 104 may comprise a center pillar 150 and/or sidewalls 152. The center pillar 150 and the sidewalls 152 may create a general 'M' shape of the cross-section of the apparatus 100 shown. While the 'M' shape is shown for cross-section, the center pillar 150 may be implemented at a center of the apparatus 100 and the sidewalls 152 may be formed along all four sides of the apparatus 100. For example, the center pillar 150 may be implemented at a center of the square (or hexagonal) shape of the apparatus 100.

The shape of the center pillar 150 and the sidewalls 152 of the top PCB 104 may form a cavity 160 when the top PCB 104 is attached to the bottom PCB 102. In the cross-section view shown, the cavity 160 may appear as two separate cavities. However, with the center pillar 150 implemented at a center of the top PCB 104, the cavity 160 may also extend in front of and behind the center pillar 150. The arrangement of the cavity 160 around the center pillar 150 may be shown in association with FIG. 7. The amplifier circuits 112a-112b (and the surface mount devices 114a-114n, if any) may be contained within the cavity 160. Generally, the cavity 160 may implement an air cavity (or air cavities as shown in association with FIG. 8) within the multi-layer active antenna module 100. The air cavity 160 may enhance electrical performance for the amplifiers 112a-112n. For example, the cavity 160 may be configured to eliminate dielectric loading on the surface of the MMIC chips 112a-112n. For example, the cavity 160 may be configured to eliminate resonance that may occur due to the bondwires 140a-140b and/or 142a-142b.

The bottom PCB 102 may be glued to the top PCB 104 using a conductive epoxy. Some areas of the bottom PCB 102 and the top PCB 104 on the dotted line 106 may be glued together. Other areas of the bottom PCB 102 and the top PCB 104 may be mechanically connected.

In the example shown, the interconnection network 120 may pass through the center pillar 150. For example, the sidewalls 152 may be solid layers (e.g., multi-laminate) and the center pillar 150 may comprise the vias for the interconnection network 120. The interconnection network 120 may receive the amplified signals INT_A-INT_B from the interconnection network 110. The interconnection network 120 may transmit the amplified signals INT_A-INT_B to the respective antenna elements 122a-122b.

The apparatus 100 may implement an active antenna module (AAM). In one example, the apparatus 100 may comprise four of the MMIC amplifier circuits 112a-112d and four of the antenna elements 122a-122d. For example, the cross-section example shown may comprise two of the amplifier circuits 112a-112b and two of the antenna elements 122a-122b of the four amplifiers and four antennas. In some embodiments, planar and/or patch antennas may be fabricated within the multi-layer lid of the module 100 using multilayer PCB fabrication methods. The apparatus 100 may comprise a quad-flat no-leads (QFN)-like footprint, outline and/or handling/assembly. The apparatus 100 may be made using PCB laminate technology (e.g., instead of QFN leadframe and/or plastic molding).

Figure 3:
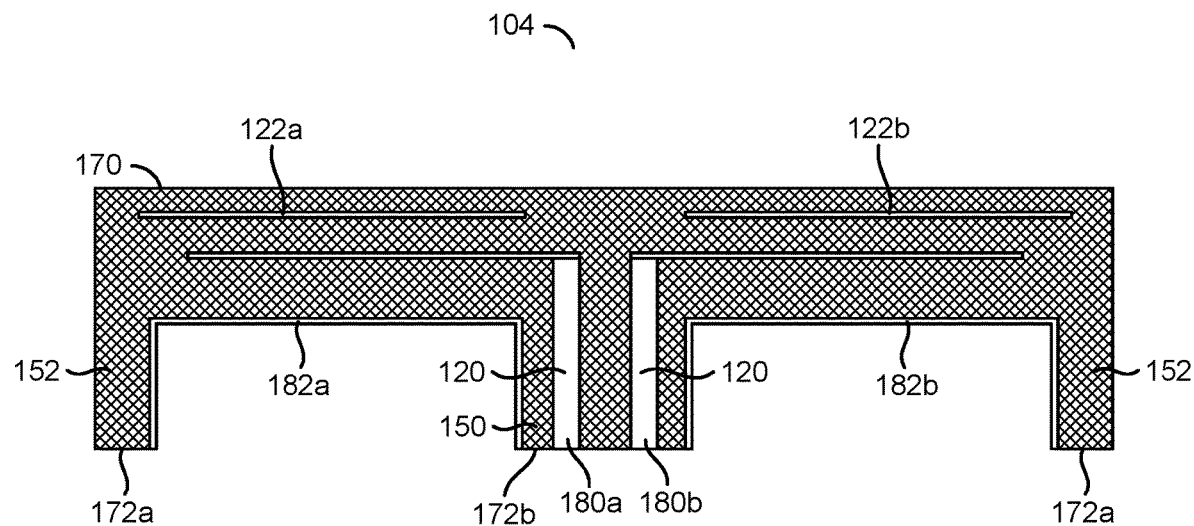
FIG. 3 is a diagram illustrating a cross-section of an antenna portion printed circuit board.

Referring to FIG. 3, a diagram illustrating a cross-section of an antenna portion printed circuit board is shown. A cross-section of the top PCB 104 is shown separate from the bottom PCB 102. In the example shown, the top PCB 104 is shown with two of the antenna elements 122a-122b. The general 'M' shape cross-section of the top PCB 104 is shown having the center pillar 150 and the sidewalls 152. The interconnection network 120 is shown extending through the center pillar 150 and to the antenna elements 122a-122b.

A surface 170 and surfaces 172a-172b of the top PCB 104 are shown. The surface 170 may be a top surface. The surfaces 172a-172b may comprise bottom surfaces. The bottom surface 172a may correspond to the sidewalls 152. The bottom surface 172b may correspond to the center pillar 150. The antenna elements 122a-122b may be mounted on and/or embedded in the top surface 170 of the top PCB 104. Mounting the antenna elements 122a-122b on the top surface 170 may facilitate the RF communication 124a-124b. The bottom surfaces 172a-172b may be configured to mount onto the bottom PCB 102. For example, the bottom surfaces 172a-172b may be placed to sit flat on the bottom PCB 102 and may be affixed using a conductive and/or a non-conductive epoxy to glue the top PCB 104 and the bottom PCB 102 together. Gluing the top PCB 104 and the bottom PCB 102 together may create the active antenna module 100.

Vias 180a-180b are shown. The vias 180a-180b may comprise a combination of plated through holes, blind vias and/or buried vias. The vias 180a-180b may be configured to interconnect the DC signals and/or the RF signals between the components (e.g., the amplifier circuits 112a-112n and/or the surface mount devices 114a-114n) and the antenna elements 122a-122n. In the example shown, the two vias 180a-180b may connect an output from the two amplifier circuits 112a-112b (e.g., the amplified RF signals INT_A-INT_B from the connections 142a-142b) to the antenna elements 122a-122b.

The antenna elements 122a-122b may comprise a horizontal copper layer, which may be connected to the vias 180a-180b and the metal layers of the top surface 170. In one example, the bottom surface 172b of the center pillar 150 with the vias 180a-180b may be glued to the bottom PCB 102 using a conductive epoxy. In another example, the bottom surface 172a of the sidewalls 152 may be glued to the bottom PCB 102 using a non-conductive epoxy.

Layers 182a-182b are shown on an inner surface of the top PCB 104. The inner surface of the top PCB 104 comprising the layers 182a-182b may form the inner surface of the cavity 160 when the top PCB 104 is affixed to the bottom PCB 102. The layers 182a-182b may comprise a conductive layer. The conductive layers 182a-182b may comprise a coating that may aid RF communication performance (e.g., grounding, reduce resonances, etc.). In one example, the conductive layers 182a-182b may comprise a copper material. In another example, the conductive layers 182a-182b may comprise a gold material. In yet example, the conductive layers 182a-182b may comprise a silver material. The conductive layers 182a-182b may comprise a conductive plating. The material, thickness, and or RF properties of the conductive layers 182a-182b may be varied according to the design criteria of a particular implementation.

In the example shown, the top PCB 104 may implement four patch antennas 122a-122d at a Ka band. The center pillar 150 may be configured to eliminate and/or reduce resonances. In some embodiments, the interconnection network 120 may be implemented along the sidewalls 152 (to be described in association with FIG. 11).

The top PCB 104 may be designed for properties that may enhance and/or enable antenna communication performance. The top PCB 104 may be designed to provide mechanical protection. The mechanical protection may prevent the amplifier circuits 112a-112n and/or the surface mount devices 114a-114n from being damaged within the cavity 160. For example, the cavity 160 may provide mechanical protection and/or protection from external elements.

Figure 4:
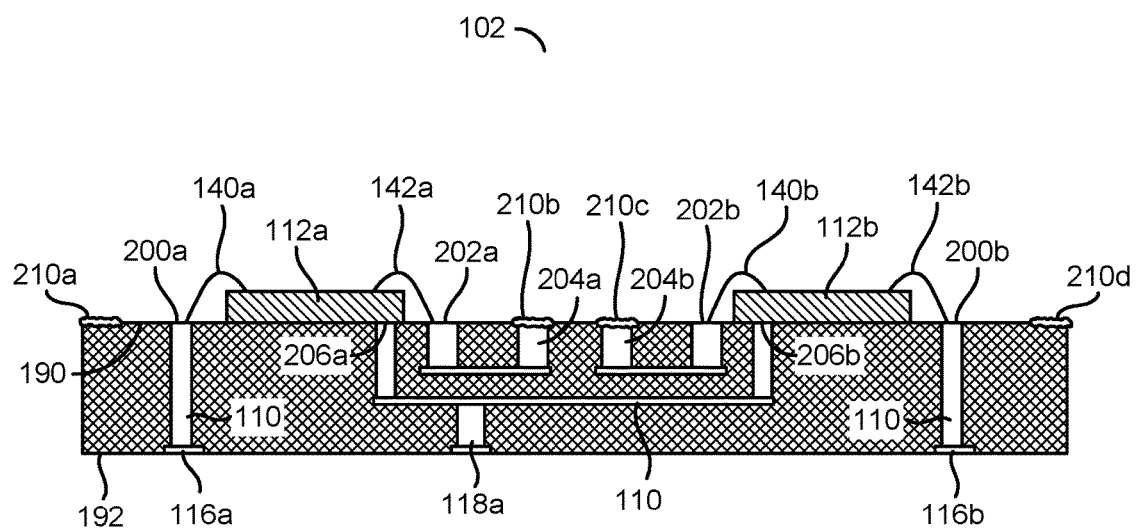
FIG. 4 is a diagram illustrating a cross-section of an amplifier portion printed circuit board.

Referring to FIG. 4, a diagram illustrating a cross-section of an amplifier portion printed circuit board is shown. A cross-section of the bottom PCB 102 is shown separate from the top PCB 104. In the example shown, the bottom PCB 102 is shown with two of the amplifier circuits 112a-112b, two of the mounting pads 116a-116b and one of the mounting pads 118a. No surface mount devices 114a-114n are implemented in the example shown. In the example shown, the bottom PCB 102 may comprise a rectangular shape. The interconnection network 110 is shown extending from the mounting pads 116a-116b and the mounting pad 118a and through the bottom PCB 102.

A surface 190 and a surface 192 of the bottom PCB 102 are shown. The surface 190 may be a top surface. The top surface 190 may be a flat surface for the bottom PCB 102. The surface 192 may comprise a bottom surface. The amplifier circuits 112a-112b and/or any surface mount devices 114a-114n may be mounted on the top surface 190 of the bottom PCB 102. The mounting pads 116a-116b and/or the mounting pad 118a may be mounted on the bottom surface 192 of the bottom PCB 102.

The interconnection network 110 may comprise through vias 200a-200b, blind vias 202a-202b, blind vias 204a-204b and/or blind vias 206a-206b. The vias 200a-200b may provide the input signals RFIN_A-RFIN_B from the mounting pads 116a-116b to the connectors 140a-140b of the amplifier circuits. The blind vias 202a-202b may provide the amplified signals INT_A-INT_B to the blind vias 204a-204b, which may connect to the vias 180a-180b in the center pillar 150 of the top PCB 104. The mounting pad 118a may provide the bias signal BIAS_A to the blind vias 206a-206b, which may be presented to the amplifier circuits 112a-112b. The various interconnections between the mounting pads 116a-116b, the mounting pad 118a, the connectors 140a-140b, the connectors 142a-142b and/or the top PCB 104 may be varied according to the design criteria of a particular implementation.

Glue material 210a-210d is shown. The glue material 210a-210d may comprise a conductive epoxy. The glue material 210a-210d is shown on the top surface 190 of the bottom PCB 102. In the example shown, the locations of the glue material 210a and the glue material 210d generally correspond with the location of the sidewalls 152 of the top PCB 104 and the location of the glue material 210b-210c may generally correspond with the location of the center pillar 150 of the top PCB 104. For example, the bottom surfaces 172a-172b of the top PCB 104 may be pressed against the glue material 210a-210d on the top surface 190 of the bottom PCB 102 to affix the bottom PCB 102 to the top PCB 104 and create the cavity 160 around the amplifier circuits 112a-112b. In some embodiments, the glue material 210a-210d may be located on only some regions of the top surface 190. For example, some regions of the top PCB 104 and the bottom PCB 102 may be glued together using the conductive epoxy while other regions of the top PCB 104 and the bottom PCB 102 may be mechanically connected. The type of the glue material 210a-210d, the amount of the glue material 210a-210d and/or the regions of the top surface 190 where the glue material 210a-210d is implemented may be varied according to the design criteria of a particular implementation.

In one example, the amplifier circuits 112a-112n may comprise power amplifiers. In another example, the amplifier circuits 112a-112n may comprise low noise amplifiers. In yet another example, the amplifier circuits 112a-112n may comprise GaN amplifiers. In still another example, the amplifier circuits 112a-112n may comprise GaAs amplifiers. In some embodiments, the combination of the amplifier circuits 112a-112n and the surface mount devices 114a-114n may implement beamformer circuits (e.g., comprising amplifier gain and phase control). The type of the amplifier circuits 112a-112n implemented may be varied according to the design criteria of a particular implementation.

The bottom PCB 102 may be designed for properties that may enhance thermal performance. For example, the bottom PCB 102 may provide heatsinking for the amplifier circuits 112a-112n. In an example, the mounting pads 116a-116b and/or the mounting pad 118a may provide heat dissipation. The interconnection network 110 may provide an electrical connection from the bottom PCB 102 to the top PCB 104.

Figure 5:
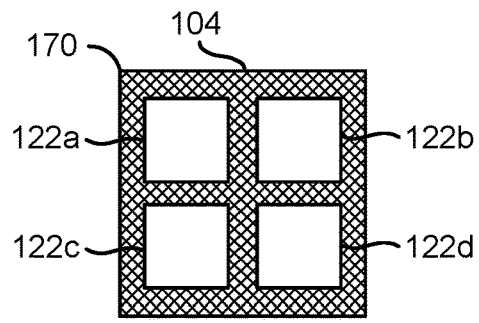
FIG. 5 is a diagram illustrating a top view of an antenna portion printed circuit board.

Referring to FIG. 5, a diagram illustrating a top view of an antenna portion printed circuit board is shown. The top surface 170 of the top PCB 104 is shown. The top PCB 104 (and the apparatus 100) is shown having a square shape. Four of the antenna elements 122a-122d are shown. In the example shown, the antenna elements 122a-122d may be arranged in a square arrangement. For example, the antenna elements 122a-122d may generally be equally spaced apart from each other. The antenna elements 122a-122d may be connected to the square shaped copper patches and/or may comprise the horizontal copper layer, which may be connected to the vias 180a-180b and the metal layers on the top surface 170.

In some embodiments, the antenna elements 122a-122d may be arranged based on desired characteristics of the wireless communication 124a-124d. In an example, the arrangement of the antenna elements 122a-122d may result in the wireless communication 124a-124d creating interference patterns. For example, the arrangement of the antenna elements 122a-122d may be selected for short range and/or long range communication. The arrangement of the antenna elements 122a-122d may be varied according to the design criteria of a particular implementation.

Figure 6:
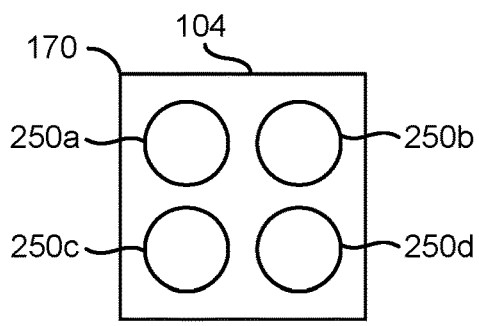
FIG. 6 is a diagram illustrating a top view of an alternate embodiment of an antenna portion printed circuit board.

Referring to FIG. 6, a diagram illustrating a top view of an alternate embodiment of an antenna portion printed circuit board is shown. The top surface 170 of the top PCB 104 is shown. The top PCB 104 (and the apparatus 100) is shown having the square shape. Four patches 250a-250d for the antenna elements 122a-122d are shown. In some embodiments, the patches 250a-250d may be implemented having a square (or rectangular) shape. In some embodiments, the patches 250a-250d for the antenna elements 122a-122d (or similar patches for the amplifier circuits 112a-112d on the bottom PCB 102) may have a circular shape.

Figure 7:
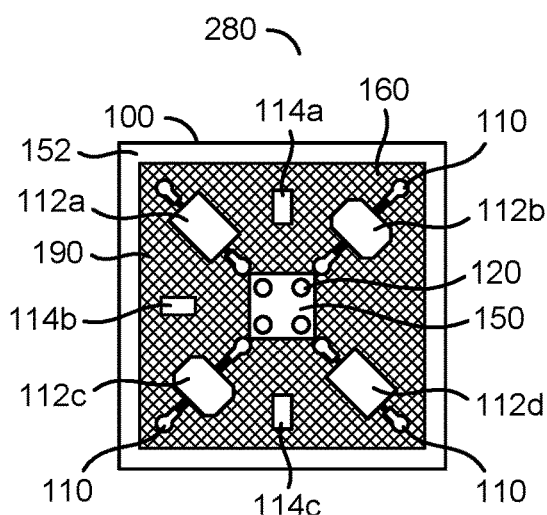
FIG. 7 is a diagram illustrating a top view of an amplifier portion printed circuit board with a single cavity implementation.

Referring to FIG. 7, a diagram illustrating a top view of an amplifier portion printed circuit board with a single cavity implementation is shown. A cross-sectional top down view 280 of the apparatus 100 is shown. The cross-sectional top down view 280 of the apparatus 100 may comprise a view partially through the top PCB 104 and onto the bottom PCB 102. For example, the cross-sectional top down view 280 may be provided at a level below the antenna elements 122a-122n and through the cavity 160.

In the example shown, the apparatus 100 may implement a single cavity 160. The sidewalls 152 are shown along the outside of the apparatus 100. The center pillar 150 is shown through a center of the apparatus 100. The cavity 160 may be implemented within the sidewalls 152 and around the center pillar 150 (e.g., the cavity 160 may surround the center pillar 150). The interconnection network 120 of the top PCB 104 may be implemented through the center pillar 150. The outside walls of the center pillar 150 and the inner walls of the sidewalls 152 (e.g., the inner surfaces of the cavity 160) may be coated with the conductive layers 182a-182b (not shown).

The top surface 190 of the bottom PCB 102 may be visible within the cavity 160 from the perspective of the cross-sectional top down view 280. The amplifier circuits 112a-112d are shown on the top surface 190 of the bottom PCB 102. The amplifier circuits 112a-112d may be mounted to the top surface 190 in a generally square shaped (or rectangular shaped) arrangement. The MMIC packages of the amplifier circuits 112a-112d are shown having generally a rectangular shape. Vias for the interconnection network 110 for the bottom PCB 102 are shown near the amplifier circuits 112a-112d. The surface mount devices 114a-114c are shown implemented on the top surface 190 within the cavity 160. The arrangement of the amplifier circuits 112a-112d and/or the surface mount devices 114a-114c within the cavity 160 may be varied according to the design criteria of a particular implementation.

Figure 8:
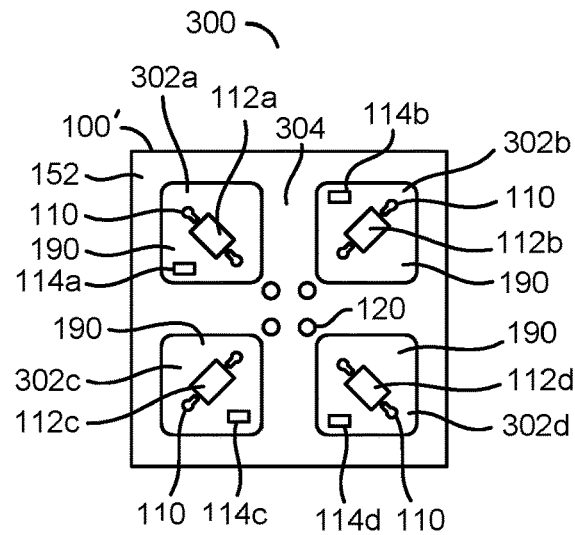
FIG. 8 is a diagram illustrating a top view of an amplifier portion printed circuit board with a multiple cavity implementation.

Referring to FIG. 8, a diagram illustrating a top view of an amplifier portion printed circuit board with a multiple cavity implementation is shown. A cross-sectional top down view 300 of the apparatus 100' is shown. The apparatus 100' may comprise multiple cavities 302a-302d instead of the single cavity 160. The cross-sectional top down view 300 of the apparatus 100' may comprise a view partially through the top PCB 104 and onto the bottom PCB 102. For example, the cross-sectional top down view 300 may be provided at a level below the antenna elements 122a-122n and through the cavities 302a-302d.

In the example shown, the apparatus 100 may implement the multiple cavities 302a-302d. Four of the multiple cavities 302a-302d implemented for each of the four amplifier circuits 112a-112d are shown as an illustrative example. However, more or fewer of the multiple cavities 302a-302d may be implemented depending on the number of the amplifier circuits 112a-112d implemented. Generally, one of the multiple cavities 302a-302d may be implemented for each of the amplifier circuits 112a-112d. In some embodiments, more than one of the amplifier circuits 112a-112d and/or more than one of the surface mount devices 114a-114d may be implemented within each of the multiple cavities 302a-302d. The number of the multiple cavities 302a-302d implemented and/or the number of the amplifier circuits 112a-112n and/or the number of surface mount devices 114a-114n implemented within each of the multiple cavities 302a-302d may be varied according to the design criteria of a particular implementation.

The sidewalls 152 are shown along the outside of the apparatus 100'. Interior walls 304 may be implemented throughout a central portion of the top PCB 104. The interior walls 304 may be implemented for the multiple cavities 302a-302d instead of the center pillar 150. In the example shown, the interior walls 304 may implemented a cross shape. The cross shape of the interior walls 304 and the sidewalls 152 may form the multiple cavities 302a-302d. The interior walls 304 may be implemented having other shapes depending on the number and/or layout of the multiple cavities 302a-302n. The interconnection network 120 of the top PCB 104 may be implemented through the interior walls 304. The walls of the interior walls 304 and the inner walls of the sidewalls 152 (e.g., the inner surfaces of the multiple cavities 302a-302d) may be coated with the conductive layers 182a-182b (not shown). The sidewalls 152 and/or the interior walls 304 may comprise metallized walls.

The top surface 190 of the bottom PCB 102 may be visible within the multiple cavities 302a-302d from the perspective of the cross-sectional top down view 300. The amplifier circuits 112a-112d are shown on the top surface 190 of the bottom PCB 102. The amplifier circuits 112a-112d may be mounted to the top surface 190 in a generally square shaped (or rectangular shaped) arrangement. The MMIC packages of the amplifier circuits 112a-112d are shown having generally a rectangular shape. Vias for the interconnection network 110 for the bottom PCB 102 are shown near the amplifier circuits 112a-112d within each of the respective multiple cavities 302a-302d. Respective surface mount devices 114a-114d are shown implemented on the top surface 190 within the multiple cavities 302a-302d. Implementing the amplifier circuits 112a-112d and/or one or more of the surface mount devices 114a-114d each within a respective one of the multiple cavities 302a-302d may eliminate and/or reduce resonances, reduce cross-talk between the amplifier circuits 112a-112d and/or reduce interference. While only one of the surface mount devices 114a-114d are shown within each of the multiple cavities 302a-302d, the number of the surface mount devices 114a-114d implemented along with each of the amplifier circuits 112a-112d in each of the multiple cavities 304a-304d may be varied according to the design criteria of a particular implementation.

Figure 9:
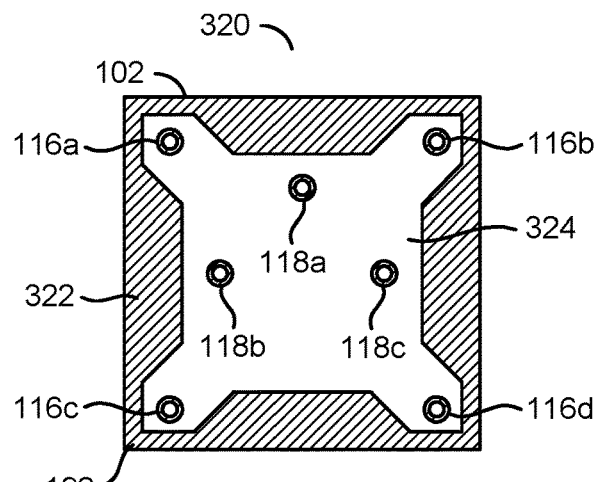
FIG. 9 is a diagram illustrating a bottom view of an amplifier portion printed circuit board.

Referring to FIG. 9, a diagram illustrating a bottom view of an amplifier portion printed circuit board is shown. A bottom view 320 of the apparatus 100 is shown. The bottom view 320 may comprise the bottom surface 192 of the bottom PCB 102. In the example shown, the apparatus 100 may have a square (or rectangular) shape.

The bottom surface 192 may comprise a laminate material 322 and/or a ground plane 324. The mounting pads 116a-116d and/or the mounting pads 118a-118c are shown on the ground plane 324. In the example shown, the apparatus 100 may comprise four of the mounting pads 116a-116d (e.g., one for each of the four amplifier circuits 112a-112d) and three of the mounting pads 118a-118c. The mounting pads 116a-116d may be configured to receive the RF input signals RFIN_A-RFIN_D. The mounting pads 118a-118c may be configured to receive the bias input signals BIAS_A-BIAS_C.

Figure 10:
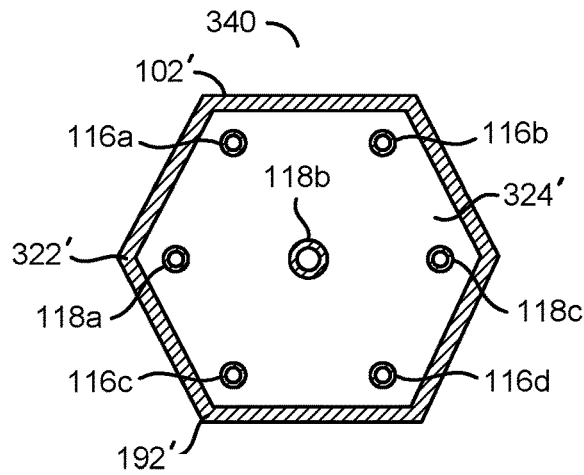
FIG. 10 is a diagram illustrating a bottom view of an amplifier portion printed circuit board having a hexagonal shape.

Referring to FIG. 10, a diagram illustrating a bottom view of an amplifier portion printed circuit board having a hexagonal shape is shown. A bottom view 340 of the apparatus 100 is shown. The bottom view 340 may comprise the bottom surface 192' of the bottom PCB 102'. In the example shown, the apparatus 100 may have a hexagonal shape.

The bottom surface 192 may comprise a laminate material 322' and/or a ground plane 324'. The laminate material 322' and/or the ground plane 324' may be implemented having the hexagonal shape to fit the shape of the apparatus 100. The mounting pads 116a-116d and/or the mounting pads 118a-118c are shown on the ground plane 324'. In the example shown, the apparatus 100 may comprise four of the mounting pads 116a-116d (e.g., one for each of the four amplifier circuits 112a-112d) and three of the mounting pads 118a-118c. The mounting pads 116a-116d may be configured to receive the RF input signals RFIN_A-RFIN_D. The mounting pads 118a-118c may be configured to receive the bias input signals BIAS_A-BIAS_C.

Similarly, for the hexagonal shape of the apparatus 100, the top surface 170' of the top PCB 104' (not shown) may have a hexagonal shape. For example, the antenna elements 122a-122d may be implemented in the same arrangement as shown in association with FIG. 5, but within a hexagonal shape instead of the square shape.

Figure 11:
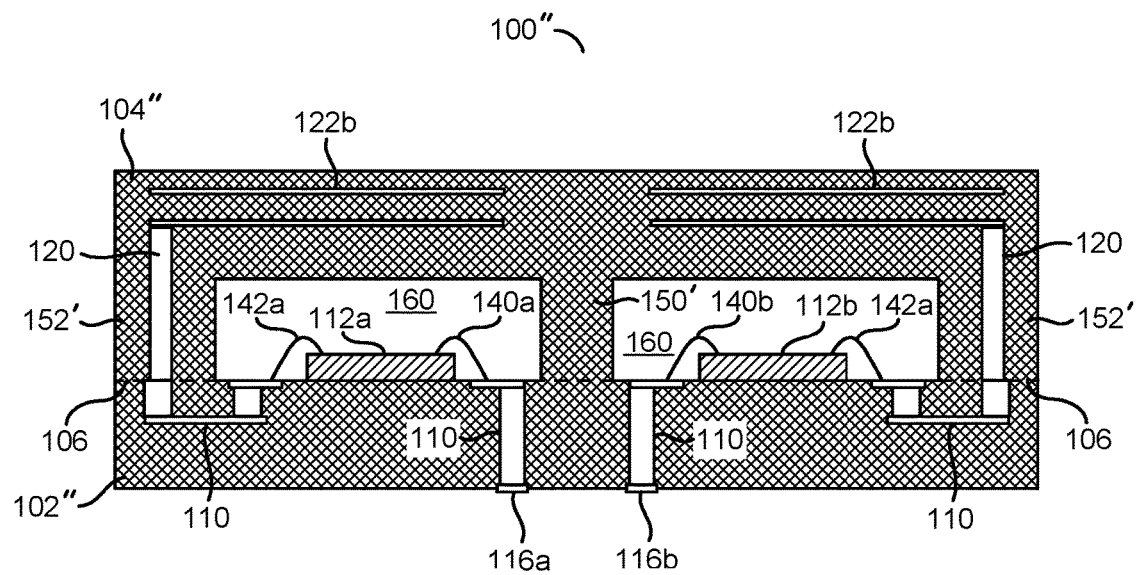
FIG. 11 is a diagram illustrating a cross-section view of an example embodiment comprising a connection network in outer walls of the antenna portion printed circuit board.

Referring to FIG. 11, a diagram illustrating a cross-section view of an example embodiment comprising a connection network in outer walls of the antenna portion printed circuit board is shown. The apparatus 100" is shown. The apparatus 100" may comprise the bottom PCB 102" and the top PCB 104". The bottom PCB 102" and the top PCB 104" may have a similar implementation as the bottom PCB 102 and the top PCB 104 of the apparatus 100 described in association with FIG. 2. The bottom PCB 102" may comprise the interconnection network 110, the amplifier circuits 112a-112b, the connectors 140a-140b and the connectors 142a-142b. The top PCB 104" may comprise the interconnection network 120 and the antenna elements 122a-122b. Affixing the top PCB 104" to the bottom PCB 102" may form the single cavity 160.

In the example embodiment of the apparatus 100", the interconnection network 120 of the top PCB 104" may be run through the sidewalls 152' instead of the center pillar 150'. The center pillar 150' may comprise solid layers of laminate material without the vias for the interconnection network 120. The center pillar 150' may be implemented for providing structural support for the single cavity 160 and providing mechanical protection for the amplifier circuits 112a-112b.

In some embodiments, the apparatus 100" may be implemented without the center pillar 150'. For example, with the interconnection network 120 configured to run through the sidewalls 152', the center pillar 150' may not provide a structural and/or functional benefit to the apparatus 100". Implementing the apparatus 100" without the center pillar 150' may enable the apparatus 100" to be implemented using less material. Implementing the apparatus 100" without the center pillar 150' may enable the total volume of the cavity 160 to be larger (e.g., since the center pillar 150' may not occupy space within the cavity 160).

In the example shown, the mounting pads 116a-116b may be implemented closer to a center of the apparatus 100". The interconnection network 110 of the bottom PCB 102" may present the input RF signals RFIN_A-RFIN_B to the connectors 140a-140b of the amplifier circuits 112a-112b. The amplifier circuits 112a-112b may be configured to amplify the input RF signals RFIN_A-RFIN_B and generate the amplified signals INT_A-INT_B. The connectors 142a-142b may present the amplified signals INT_A-INT_B to the interconnection network 110 located towards the outer edge of the bottom PCB 102". The interconnection network 110 may present the amplified signals INT_A-INT_B to the interconnection network 120 of the top PCB 104". The interconnection network 120 of the top PCB 104" may run through the sidewalls 152'. The interconnection network 120 may extend through the sidewalls 152' up to the antenna elements 122a-122b. The amplified signals INT_A-INT_B may be presented to the antenna elements 122a-122b.

Figure 12:
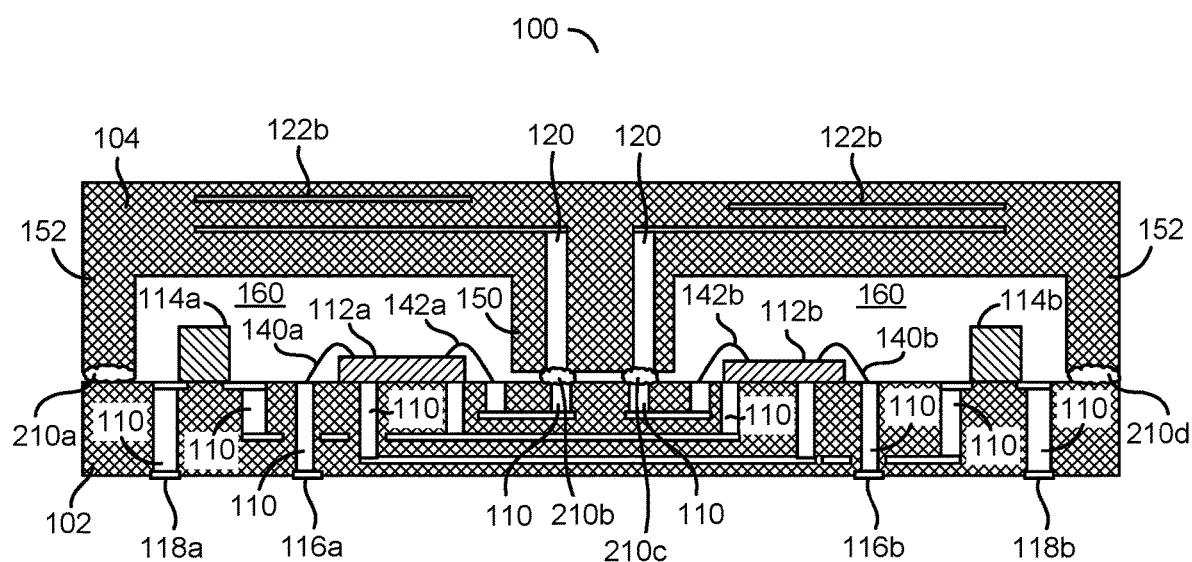
FIG. 12 is a diagram illustrating a cross-section view of an example embodiment comprising additional surface mount devices.

Referring to FIG. 12, a diagram illustrating a cross-section view of an example embodiment comprising additional surface mount devices is shown. The apparatus 100 is shown. The apparatus 100 may comprise the bottom PCB 102 and the top PCB 104. The bottom PCB 102 and the top PCB 104 may have a similar implementation as the bottom PCB 102 and the top PCB 104 of the apparatus 100 described in association with FIG. 2. The bottom PCB 102 may comprise the interconnection network 110, the amplifier circuits 112a-112b, the connectors 140a-140b and the connectors 142a-142b. In the example shown, the bottom PCB 102 may further comprise the mounting pads 118a-118b and the surface mount devices 114a-114b. The top PCB 104 may comprise the interconnection network 120 and the antenna elements 122a-122b. In the example shown, the interconnection network 120 may be implemented through the center pillar 150. However, in some embodiments, with the surface mount devices 114a-114n implemented, the interconnection network 120 may be implemented through the sidewalls 152. The glue material 210a-210d is shown in between the bottom PCB 102 and the top PCB 104. The glue material 210a-210d may be implemented to affix the top PCB 104 to the bottom PCB 102 in order to form the single cavity 160.

The cavity 160 may comprise the amplifier circuits 112a-112n and/or the surface mount devices 114a-114n. In the example shown, one of the surface mount devices 114a-114b may be implemented with a respective one of the amplifier circuits 112a-112b. The bottom PCB 102 may implement various integrated circuits 114a-114n. In one example, the integrated circuits 114a-114n may comprise Si beamformers. In another example, the integrated circuits 114a-114n may comprise surface mount devices and/or chip caps. Both bare dies and/or packaged devices may be implemented. In some embodiments, more integrated components may be implemented. In an example, the amplifier circuits 112a-112n and/or the surface mount devices 114a-114n may be implemented as a beamformer chip (e.g., comprising an amplifier, gain control and phase control).

In the example shown, the mounting pads 116a-116b and the mounting pads 118a-118b may be implemented on the bottom surface 192 of the bottom PCB 102. The interconnection network 110 of the bottom PCB 102 may present the input RF signals RFIN_A-RFIN_B from the mounting pads 116a-116b to the connectors 140a-140b of the amplifier circuits 112a-112b. The interconnection network 110 of the bottom PCB 102 may present the input DC bias signals BIAS_A-BIAS_B from the mounting pads 118a-118b to the surface mount devices 114a-114b. The surface mount devices 114a-114b may be configured to present the bias signals and/or control signals SM_A-SM_B to the amplifier circuits 112a-112b. In one example, the bias and/or control signals SM_A-SM_B may be configured to control a phase and/or gain of the amplifier circuits 112a-112b. The interconnection network 110 may comprise vias and/or traces that may connect the surface mount devices 114a-114n to the amplifier circuits 112a-112n. The interconnection network 110 may comprise vias and/or traces that may connect the amplifier circuits 112a-112n to other of the amplifier circuits 112a-112n. The interconnection network 110 may comprise vias and/or traces that connect the amplifier circuits 112a-112n to the interconnection network 120 of the top PCB 104.

In response to the input RF signals RFIN_A-RFIN_B and the bias signals BIAS_A-BIAS_B (or SM_A-SM_B), the amplifier circuits 112a-112b may be configured to amplify the input RF signals RFIN_A-RFIN_B and generate the amplified signals INT_A-INT_B. The connectors 142a-142b may present the amplified signals INT_A-INT_B to the interconnection network 110 located towards the center of the bottom PCB 102. The interconnection network 110 may present the amplified signals INT_A-INT_B to the interconnection network 120 of the top PCB 104. The interconnection network 120 of the top PCB 104 may run through the center pillar 150. The interconnection network 120 may extend through the center pillar 150 up to the antenna elements 122a-122b. The amplified signals INT_A-INT_B may be presented to the antenna elements 122a-122b.

As an illustrative example, the apparatus 100 may have been described in the context of transmitting RF signals and/or wireless data (e.g., the amplifier circuits 112a-112n receive the RF input signals RFIN_A-RFIN_N and the antenna elements 122a-122n transmit the wireless information 124a-124n). In some embodiments, the apparatus 100 may be configured to receive RF signals and/or other wireless data. For example, the antenna elements 122a-122n may be configured to receive the wireless information 124a-124n and the amplifier circuits 112a-112n may present the received wireless information to the mounting pads 116a-116n. In some embodiments, the apparatus 100 may operate as a receive only device. In some embodiments, the apparatus 100 may operate as a transmit only device. In some embodiments, the apparatus 100 may operate as a transmit/receive device. The direction of communication and/or the frequency bands communicated using the apparatus 100 may be varied according to the design criteria of a particular implementation.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICS, FPGAS (field programmable gate arrays), PLDs (programmable logic devices), CPLDs (complex programmable logic devices), sea-of-gates, RFICS (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. Execution of instructions contained in the computer product by the machine, may be executed on data stored on a storage medium and/or user input and/or in combination with a value generated using a random number generator implemented by the computer product. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMS (erasable programmable ROMs), EEPROMs (electrically erasable programmable ROMs), UVPROMS (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
   a first printed circuit board comprising (i) a plurality of amplifier circuits, (ii) a plurality of inputs and (ii) a first interconnection network; and
   a second printed circuit board comprising (i) a plurality of antenna modules and (ii) a second interconnection network, wherein
   (i) said first interconnection network is configured to connect (a) each of said inputs to a respective one of said plurality of amplifier circuits and (b) said plurality of amplifier circuits to said second interconnection network,
   (ii) said second interconnection network is configured to connect said amplifier circuits to said plurality of antenna modules, and
   (iii) said first printed circuit board is affixed to said second printed circuit board using a conductive epoxy material.

2. The apparatus according to claim 1, wherein an air cavity is formed between said first printed circuit board and said second printed circuit board.

3. The apparatus according to claim 2, wherein said second printed circuit board comprises a pillar implemented through a center of said air cavity.

4. The apparatus according to claim 3, wherein an inner surface of said air cavity is coated in a conductive layer.

5. The apparatus according to claim 3, wherein said second interconnection network is implemented through said pillar.

6. The apparatus according to claim 2, wherein said plurality of amplifier circuits are within said air cavity when said first printed circuit board is affixed to said second printed circuit board.

7. The apparatus according to claim 6, wherein said air cavity is configured to eliminate dielectric loading on a surface of said plurality of amplifier circuits and provide mechanical protection.

8. The apparatus according to claim 6, wherein (i) said first printed circuit board further comprises a plurality of first circuits and a plurality of second circuits implemented within said air cavity and (ii) said first interconnection network is configured to connect said plurality of first circuits and said plurality of second circuits to said plurality of amplifier circuits.

9. The apparatus according to claim 8, wherein said first circuits comprise active components and said second circuits comprise passive components.

10. The apparatus according to claim 8, wherein said first circuits and said second circuits are configured to implement one or more of a beamformer, a chip cap and a surface mount device.

11. The apparatus according to claim 8, wherein at least one of (i) bare dies and (ii) packaged devices are used to implement said plurality of amplifier circuits, said plurality of first circuits and said plurality of second circuits.

12. The apparatus according to claim 2, wherein (i) said second printed circuit board comprises sidewalls and (ii) said second interconnection network is implemented through said sidewalls.

13. The apparatus according to claim 1, wherein (i) a plurality of air cavities are formed between said first printed circuit board and said second printed circuit board and (ii) each of said plurality of amplifier circuits are implemented within one of said plurality of air cavities.

14. The apparatus according to claim 1, wherein (i) said first printed circuit board further comprises a bias input and (ii) said first interconnection network is configured to connect said bias input to each of said plurality of amplifier circuits.

15. The apparatus according to claim 1, wherein said plurality of amplifier circuits comprise at least one of power amplifiers and low noise amplifiers.

16. The apparatus according to claim 1, wherein said plurality of amplifier circuits are each implemented as part of respective beamformer circuits, said respective beamformer circuits further comprising gain control and phase control.

17. The apparatus according to claim 1, wherein said plurality of antenna modules are configured to transmit and receive signals.

18. The apparatus according to claim 1, wherein said apparatus is implemented to create a phased array of antennas.

19. The apparatus according to claim 1, wherein said first printed circuit board is configured to perform heatsinking for thermal performance and said second printed circuit board is configured to provide communication performance for said antenna modules.

20. An apparatus comprising:
   a first printed circuit board comprising (i) an amplifier circuit, (ii) an input and (ii) a first interconnection network; and
   a second printed circuit board comprising (i) an antenna module and (ii) a second interconnection network, wherein
   (i) said first interconnection network is configured to connect (a) said input to said amplifier circuit and (b) said amplifier circuit to said second interconnection network,
   (ii) said second interconnection network is configured to connect said amplifier circuit to said antenna module,
   (iii) said first printed circuit board is affixed to said second printed circuit board using an epoxy material, and (iv) an air cavity is formed between said first printed circuit board and said second printed circuit board.

* * * * *